US010930982B2

(12) United States Patent
Yan et al.

(10) Patent No.: US 10,930,982 B2
(45) Date of Patent: Feb. 23, 2021

(54) LITHIUM ION BATTERY CHARGE/DISCHARGE CONTROL DEVICE

(71) Applicant: MAZDA MOTOR CORPORATION, Hiroshima (JP)

(72) Inventors: Tenyu Yan, Hiroshima (JP); Takashi Utsunomiya, Hiroshima (JP)

(73) Assignee: MAZDA MOTOR CORPORATION, Hiroshima (JP)

( * ) Notice: Subject to any disclaimer, the term of this patent is extended or adjusted under 35 U.S.C. 154(b) by 366 days.

(21) Appl. No.: 15/759,468

(22) PCT Filed: Dec. 5, 2016

(86) PCT No.: PCT/JP2016/086051
§ 371 (c)(1),
(2) Date: Mar. 12, 2018

(87) PCT Pub. No.: WO2017/110436
PCT Pub. Date: Jun. 29, 2017

(65) Prior Publication Data
US 2018/0261890 A1 Sep. 13, 2018

(30) Foreign Application Priority Data

Dec. 25, 2015 (JP) .............................. JP2015-254578

(51) Int. Cl.
H01M 10/44 (2006.01)
G01R 31/3842 (2019.01)
H02J 7/14 (2006.01)
H01M 10/42 (2006.01)
H01M 10/48 (2006.01)
(Continued)

(52) U.S. Cl.
CPC ............ H01M 10/44 (2013.01); B60L 1/003 (2013.01); B60L 1/02 (2013.01); B60L 58/14 (2019.02);
(Continued)

(58) Field of Classification Search
CPC .... B60L 58/16; B60L 58/20; B60L 2240/527; B60L 2240/529; B60L 2240/549; B60L 2240/547; G01R 31/392; G01R 31/374
See application file for complete search history.

(56) References Cited

U.S. PATENT DOCUMENTS 5,561,362 A * 10/1996 Kawamura ........ G01R 31/3648
320/134
6,621,250 B1 * 9/2003 Ohkubo ............. G01R 31/3842
320/136
(Continued)

FOREIGN PATENT DOCUMENTS

JP 2007-323999 A 12/2007
JP 2007323999 A * 12/2007
(Continued)

OTHER PUBLICATIONS

International Search Report issued in PCT/JP2016/086051; dated Jan. 31, 2017.

Primary Examiner — David V Henze-Gongola
Assistant Examiner — Tarikh Kanem Rankine
(74) Attorney, Agent, or Firm — Studebaker & Brackett PC

(57) ABSTRACT

A device that controls charging and discharging of a lithium ion battery (3) that starts an engine starter (1), includes: a voltage sensor (S1) that detects the voltage of the lithium ion battery; a current sensor (S2) that detects the current of the lithium ion battery; and a control section (30) that controls charging and discharging of the lithium ion battery. The control section (30) calculates capacity degradation rates of a cathode and anode of the lithium ion battery based on detected values of the voltage sensor and the current sensor at the time when a first time has elapsed, and at the time when a second time longer than the first time has elapsed, from startup of the engine starter, and limits the charging and
(Continued)

discharging of the lithium ion battery based on comparison results between the capacity degradation rates and determination criterion values.

9 Claims, 8 Drawing Sheets

(51) Int. Cl.
| | |
|---|---|
| *H02J 7/00* | (2006.01) |
| *B60L 1/00* | (2006.01) |
| *B60L 1/02* | (2006.01) |
| *B60L 58/14* | (2019.01) |
| *B60L 58/20* | (2019.01) |
| *B60L 58/15* | (2019.01) |
| *B60R 16/04* | (2006.01) |
| *H01M 10/0525* | (2010.01) |
| *B60L 58/16* | (2019.01) |
| *G01R 31/389* | (2019.01) |
| *G01R 31/36* | (2020.01) |
| *G01R 31/392* | (2019.01) |

(52) U.S. Cl.
CPC .............. *B60L 58/15* (2019.02); *B60L 58/20* (2019.02); *B60R 16/04* (2013.01); *G01R 31/3842* (2019.01); *H01M 10/0525* (2013.01); *H01M 10/42* (2013.01); *H01M 10/48* (2013.01); *H01M 10/486* (2013.01); *H02J 7/0072* (2013.01); *H02J 7/14* (2013.01); *H02J 7/1423* (2013.01); *B60L 58/16* (2019.02); *B60L 2240/545* (2013.01); *B60L 2240/547* (2013.01); *B60L 2240/549* (2013.01); *G01R 31/3648* (2013.01); *G01R 31/389* (2019.01); *G01R 31/392* (2019.01); *H01M 10/425* (2013.01); *H01M 10/441* (2013.01); *H01M 10/482* (2013.01); *H01M 2010/4271* (2013.01); *H02J 7/0048* (2020.01); *H02J 7/0069* (2020.01); *H02J 7/00304* (2020.01); *Y02T 10/70* (2013.01)

(56) References Cited

U.S. PATENT DOCUMENTS

| | | | | |
|---|---|---|---|---|
| 2007/0013347 | A1* | 1/2007 | Kamohara | B60L 3/04 320/160 |
| 2007/0224516 | A1* | 9/2007 | Deguchi | H01M 10/0569 429/339 |
| 2009/0202906 | A1* | 8/2009 | Ugaji | H01M 10/44 429/212 |
| 2010/0040913 | A1* | 2/2010 | Son | H01M 8/04701 429/492 |
| 2010/0052617 | A1* | 3/2010 | Aridome | B60L 58/16 320/132 |
| 2010/0085015 | A1* | 4/2010 | Hamaguchi | H02J 7/0069 320/134 |
| 2010/0247988 | A1* | 9/2010 | Okumura | H01M 10/48 429/90 |
| 2011/0187312 | A1* | 8/2011 | Yamamoto | H01M 10/48 320/101 |
| 2012/0007560 | A1* | 1/2012 | Smart | H01M 10/0569 320/127 |
| 2012/0065824 | A1* | 3/2012 | Takahashi | B60L 50/15 701/22 |
| 2013/0080096 | A1* | 3/2013 | Toki | G01R 31/389 702/63 |
| 2013/0099794 | A1* | 4/2013 | Takahashi | H01M 10/48 324/427 |
| 2013/0181684 | A1* | 7/2013 | Ueki | B60L 58/12 320/162 |
| 2013/0314051 | A1* | 11/2013 | Takezawa | H01M 10/44 320/134 |
| 2014/0159736 | A1* | 6/2014 | Morimoto | G01R 31/392 324/426 |
| 2014/0287287 | A1* | 9/2014 | Osaka | H01M 10/613 429/92 |
| 2015/0229150 | A1* | 8/2015 | Nakamori | H02J 7/00 320/107 |
| 2016/0011274 | A1* | 1/2016 | Morita | H01M 10/4285 702/63 |
| 2016/0104924 | A1* | 4/2016 | Kamijoh | H01M 10/613 429/62 |
| 2016/0118816 | A1* | 4/2016 | Honkura | H01M 10/48 320/134 |
| 2016/0204639 | A1* | 7/2016 | Honkura | H01M 10/48 429/50 |
| 2016/0327612 | A1* | 11/2016 | Terada | G01R 31/382 |
| 2017/0324118 | A1* | 11/2017 | Ishishita | H01M 10/443 |
| 2018/0246172 | A1* | 8/2018 | Abe | H01M 10/44 |

FOREIGN PATENT DOCUMENTS

| | | |
|---|---|---|
| JP | 5548784 B2 | 7/2014 |
| WO | 2012/073997 A1 | 6/2012 |
| WO | 2014/046179 A1 | 3/2014 |

* cited by examiner

LITHIUM ION BATTERY CHARGE/DISCHARGE CONTROL DEVICE

TECHNICAL FIELD

The technology disclosed herein relates to a lithium ion battery charge/discharge control device.

BACKGROUND ART

In recent years, from the standpoint of improving the fuel efficiency of vehicles, vehicles adopting a so-called deceleration regenerative system, in which electric power is intensively generated during deceleration of vehicles thereby lightening the burden of engines, are increasing.

In a vehicle adopting the deceleration regenerative system, a lithium ion battery capable of quicker charging and discharging than a hitherto widely-used lead battery is often mounted, aside from the lead battery, for the purpose of charging a large capacity of electric power generated during deceleration in a short time. By mounting two types of electric storage devices different in properties, it is possible to secure a sufficiently large charging capacity while recovering electric power generated during deceleration without waste.

Patent Document 1 discloses a technology of calculating the degradation rate of a battery and limiting the target charging amount and the charging and discharging voltage and current if the degradation rate is greater than a criterion, thereby reducing variations in battery life.

CITATION LIST

Patent Document

PATENT DOCUMENT 1: Japanese Unexamined Patent Publication No. 2007-323999

SUMMARY OF THE INVENTION

Technical Problem

Since the progress of degradation in the capacity of the lithium ion battery is not constant, it is necessary to estimate the degradation on a short-term basis and limit the use if the degradation has proceeded further than expected. Moreover, since the degradation rate over time is sometimes different between the cathode and anode of the lithium ion battery, it is necessary to estimate the progress of the capacity degradation for each of the cathode and the anode to perform appropriate use limitation.

In view of the above problem, an objective of the technology disclosed herein is implementing appropriate charge/discharge control of a lithium ion battery mounted in a vehicle.

Solution to the Problem

The technology disclosed herein is directed to a lithium ion battery charge/discharge control device that controls charging and discharging of a lithium ion battery that starts an engine starter, including: a voltage sensor that detects a voltage of the lithium ion battery; a current sensor that detects a current of the lithium ion battery; and a control section that controls charging and discharging of the lithium ion battery, wherein the control section calculates capacity degradation rates of a cathode and anode of the lithium ion battery based on detected values of the voltage sensor and the current sensor at the time when a first time has elapsed, and detected values of the voltage sensor and the current sensor at the time when a second time, longer than the first time, has elapsed, from startup of the engine starter, and limits the charging and discharging of the lithium ion battery based on comparison results between the capacity degradation rates of the cathode and the anode and determination criterion values for the cathode and the anode.

According to the configuration described above, the charging and discharging of the lithium ion battery is controlled according to the capacity degradation rate of each of the cathode and the anode. Therefore, it is possible to perform charge/discharge control conforming to the reality of the lithium ion battery such as that the capacity degradation proceeds in the cathode and the anode independently from each other, whereby, by delaying the progress of the capacity degradation of the lithium ion battery, the usable duration thereof can be extended.

The initial capacity of a first electrode as one of the cathode and anode of the lithium ion battery may be greater than the initial capacity of a second electrode as the other, and capacity degradation proceeds with use in both electrodes independently from each other, so that residual capacities of the first and second electrodes are reversed after a lapse of a predetermined time period from the start of use, resulting in that the residual capacity of the first electrode becomes smaller than the residual capacity of the second electrode, and the control section may use different values from each other as the determination criterion values for the cathode and the anode during the predetermined time period.

The control section may use the determination criterion value for the first electrode as the determination criterion values for the cathode and the anode after the predetermined time period.

The determination criterion value for the first electrode during the predetermined time period may be set at a value lower than the determination criterion value after the predetermined time period. Further, the determination criterion value for the first electrode may gradually increase during the predetermined time period toward the determination criterion value after the predetermined time period.

The control section may limit the charging and discharging of the lithium ion battery based on only the comparison result between the capacity degradation rate of the first electrode and the determination criterion value for the first electrode after the predetermined time period.

Advantages of the Invention

According to the technology disclosed herein, it is possible to implement appropriate charge/discharge control of a lithium ion battery mounted in a vehicle.

DESCRIPTION OF EMBODIMENTS

An exemplary embodiment will be described hereinafter in detail with reference to the drawings.

(1) Entire Configuration of Vehicle

Figure 1:
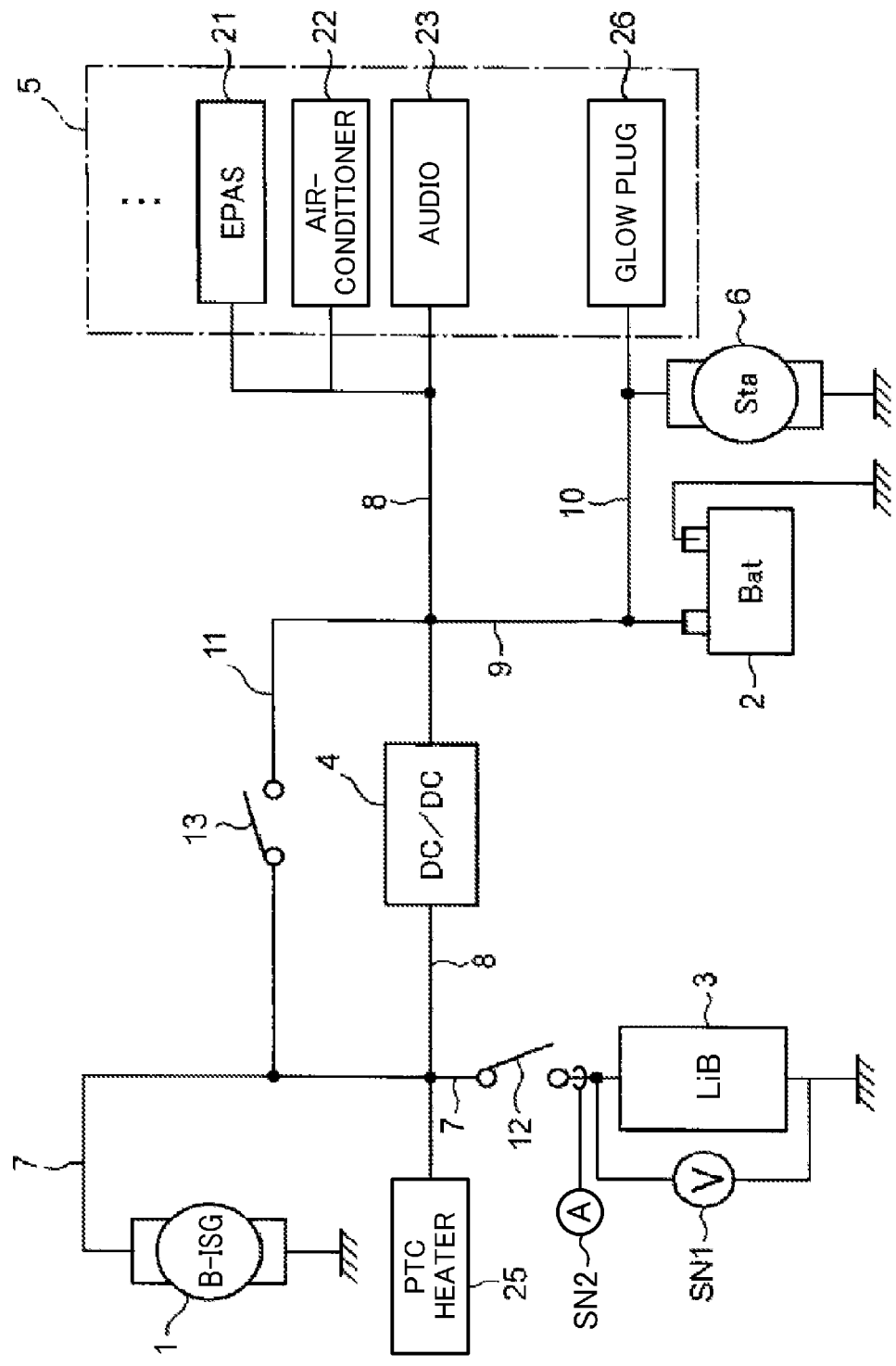
FIG. 1 is a circuit diagram showing the electrical configuration of a vehicle power control device.

FIG. 1 is a circuit diagram showing the electrical configuration of a vehicle power control device. The vehicle shown in FIG. 1 includes: a belt-driven integrated starter/generator (B-ISG) 1 that generates electric power by being powered from a gasoline engine (hereinafter, also simply called an engine) not shown provided in an engine room; a battery 2 and a lithium ion battery (LiB) 3 that store the electric power generated by the B-ISG 1; a DC/DC converter 4 that steps down the electric power generated by the B-ISG 1; an electric load 5 constituted by various electric components that consume electric power; and a starter 6 that is driven during startup of the engine to crank the engine. Note that the B-ISG 1 corresponds to an "engine starter" as defined in the claims, the starter 6 corresponds to "another starter" as defined in the claims, and the electric load 5 corresponds to "auxiliaries" as defined in the claims.

The B-ISG 1, coupled with an output axis of the engine via a pulley belt (not shown), generates electric power by rotating, in a magnetic field, a rotor that rotates in an interlocking manner with the output axis of the engine. The generated electric power is adjustable within the range up to 25 V maximum depending on an increase/decrease of the current applied to a field coil that generates the magnetic field. Also, in the B-ISG 1, a rectifier (not shown) that converts the generated AC electric power into DC electric power is embedded. That is, the electric power generated by the B-ISG 1 is transmitted to various parts after being converted into DC by the rectifier. By contrast, the B-ISG 1 receives supply of electric power from the LiB 3, thereby operating as a starter to be able to start the engine.

The battery 2 is a lead battery having a nominal voltage of 12 V general as an electric storage device for vehicles. The battery 2 has the following characteristics: while it is unsuitable for quick charging and discharging because it stores electric energy by chemical reaction, it is capable of storing a comparatively large amount of electric power because it easily secure a charging capacity.

The LiB 3 is made of a plurality of lithium ion battery cells as the basic units coupled together to increase the capacity and is capable of charging up to 25 V maximum. The LiB 3 has the following characteristics: it is capable of comparatively quick charging and discharging and is small in internal resistance because, unlike the battery 2, it stores electricity by physical absorption of lithium ions.

The DC/DC converter 4 is of a switching type in which the voltage is changed by ON/OFF (switching operation) of an embedded switching element. Note that, in this embodiment, while the DC/DC converter 4 has a function of stepping down the voltage of the electric power supplied from the B-ISG 1 or LiB 3 side to the electric load 5 or battery 2 side (i.e., from the left to the right as viewed in FIG. 1) by switching operation, it doesn't have any other function than the above, such as a function of permitting supply of electric power in the direction opposite to the above (i.e., from the right to the left as viewed in FIG. 1) and a function of boosting the voltage.

The B-ISG 1 and the LiB 3 are connected to each other via a first line 7 for power supply. A second line 8 is branched from the first line 7, and the DC/DC converter 4 is placed midway on the second line 8. From the second line 8, a third line 9 is branched, via which the battery 2 and the second line 8 are connected to each other. From the third line 9, a fourth line 10 is branched, via which the starter 6 and the battery 2 are connected to each other.

A LiB cutoff relay 12 for interrupting the connection between the B-ISG 1 and the LiB 3 is placed at a position between the branching point of the second line 8 from the first line 7 and the LiB 3. The LiB cutoff relay 12 is made switchable between ON state (closed: connected state) permitting supply of electric power from the B-ISG 1 to the LiB 3 and OFF state (open: cutoff state) cutting off the supply of electric power.

Further, a bypass line 11 is branched from the first line 7 in parallel with the second line 8, and connected to a position of the second line 8 located on the output side with respect to the DC/DC converter 4. In other words, the bypass line 11 connects the B-ISG 1 and the electric load 5 without intervention of the DC/DC converter 4, and also connects the battery 2 and the LiB 3 without intervention of the DC/DC converter 4. A bypass relay 13 is provided on the bypass line 11 to interrupt these connections. The bypass relay 13 is made switchable between ON state (closed: connected state) permitting supply of electric power via the bypass line 11 (bypassing the DC/DC converter 4) and OFF state (open: cutoff state) cutting off the supply of electric power.

The electric load 5 includes an electric power assisted steering mechanism (hereinafter abbreviated as EPAS) 21 that assists driver's steering operation using driving force such as an electric motor, an air-conditioner 22, an audio 23, etc. The electric loads such as the EPAS 21, the air-conditioner 22, and the audio 23 are connected to the first line 7 via the second line 8 with the DC/DC converter 4 provided thereon or via the bypass line 11 without the DC/DC converter 4.

A glow plug 26 is also included in the electric load 5 according to this embodiment, in addition to the electric loads such as the EPAS 21. The glow plug 26 is a heater for warming a combustion chamber of the engine (gasoline engine in this embodiment) by electrical heating during cold startup of the engine. While the glow plug 26 is connected to the battery 2 in parallel with the starter 6, a PTC heater 25, which is a heater for warming the car interior by electrical heating and operates stably even at 25 V maximum, is placed on the B-ISG 1 and LiB 3 side with respect to the DC/DC converter 4.

(2) Control System

Figure 2:
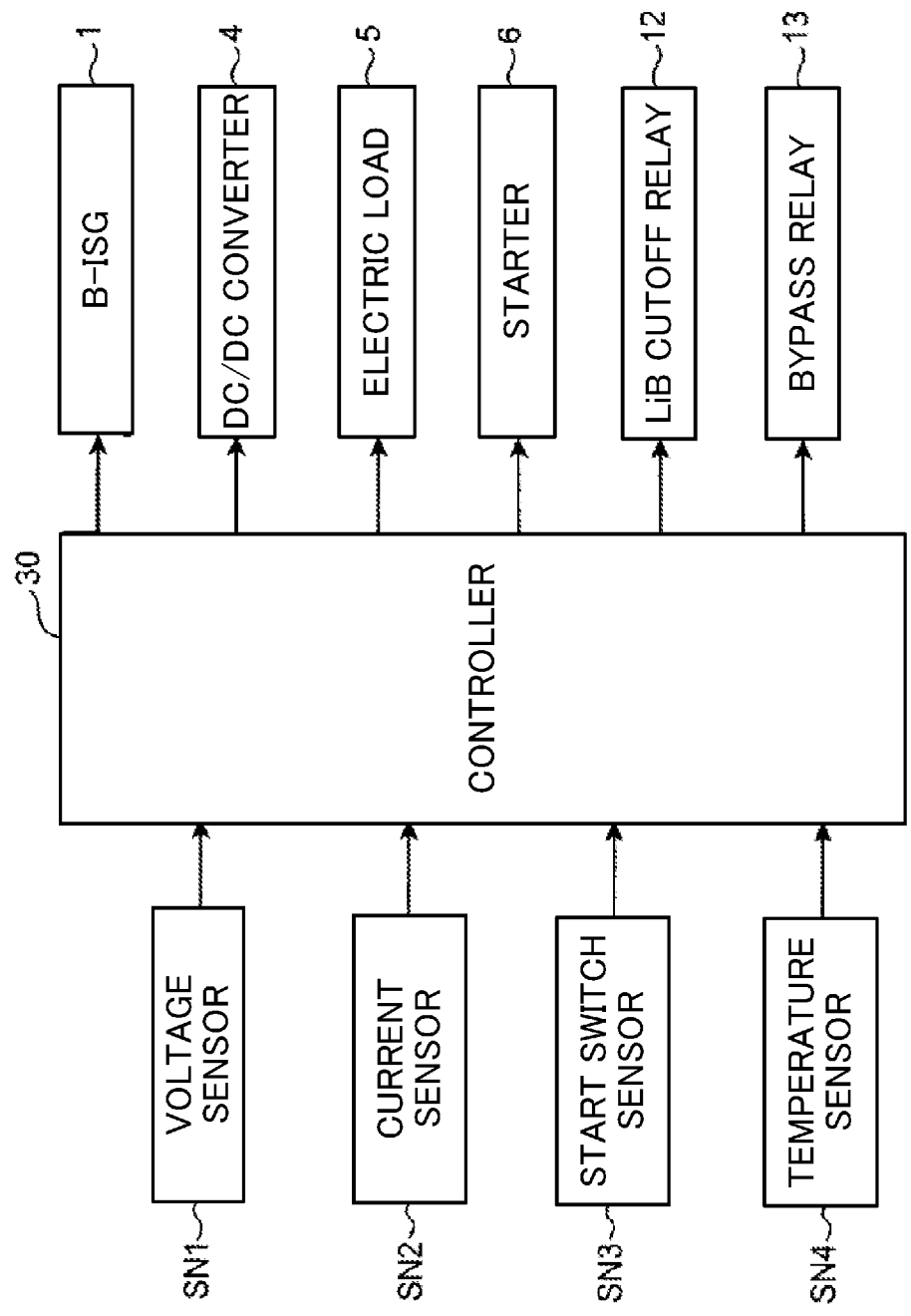
FIG. 2 is a block diagram showing the connection of a control system.

FIG. 2 is a block diagram showing the connection of the control system. As shown in FIG. 2, the components such as the B-ISG 1, the DC/DC converter 4, the starter 6, the LiB cutoff relay 12, the bypass relay 13, and the electric load 5 (the EPAS 21, the air-conditioner 22, the audio 23, etc.) are connected with a controller 30 via various signal lines and controlled based on instructions from the controller 30. The controller 30 is a microcomputer made of conventionally well-known CPU, ROM, RAM, etc. and corresponds to a "control section" as defined in the claims.

The controller 30 is also connected with various sensors provided in the vehicle via signal lines. More specifically, the vehicle according to this embodiment is provided with a voltage sensor SN1, a current sensor SN2, a start switch sensor SN3, a temperature sensor SN4, etc., and configured so that information detected by these sensors is sequentially input into the controller 30.

The voltage sensor SN1 is a sensor that detects the voltage of the LiB 3 as also shown in FIG. 1.

The current sensor SN2 is a sensor that detects the current of the LiB 3 as also shown in FIG. 1.

The start switch sensor SN3 is a sensor that detects that an ignition key not shown, which is operated by the driver when the engine is started or stopped, has been operated to an engine startup position.

The temperature sensor SN4 is a sensor that detects the water temperature of a radiator not shown.

The controller 30 controls the amount of electric power generation by the B-ISG 1 and the operation of the B-ISG 1 as a starter, the voltage step-down operation by the DC/DC converter 4, the drive/stop of the electric load 5 and the starter 6, the ON/OFF operation of the relays 12 and 13, etc., based on the input information from the sensors SN1 to SN4, and estimates the residual capacity of the LiB 3.

(3) Estimation of Residual Capacity of Lithium Ion Battery

Figure 3:
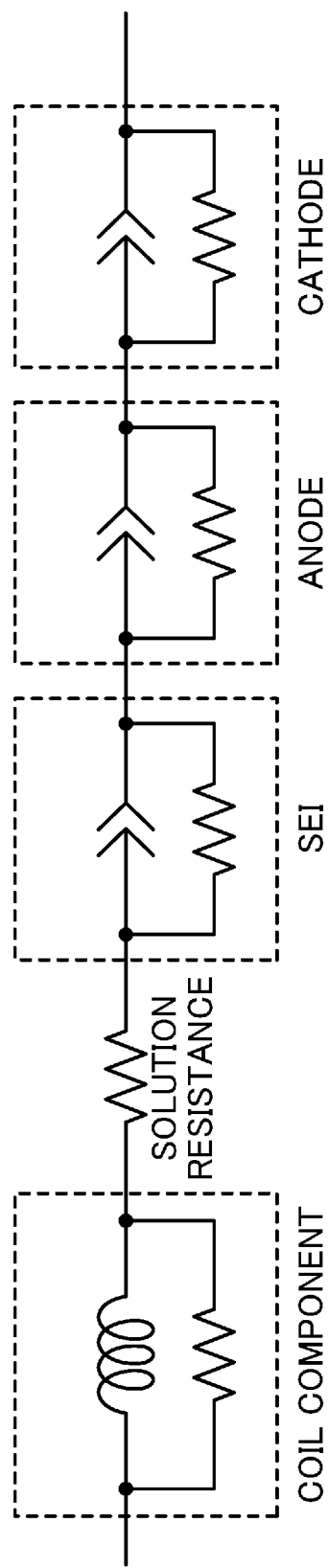
FIG. 3 is an equivalent circuit diagram of a lithium ion battery.

Next, an estimation method of the residual capacity of a lithium ion capacity in general will be described. FIG. 3 is an equivalent circuit diagram of a lithium ion battery. As illustrated, in the lithium ion battery, each of the cathode, the anode, the surface film (solid electrolyte interface (SEI)), etc. can be represented by a R-CPE (constant phase element) parallel circuit, and these R-CPE parallel circuits are connected in series.

Figure 4:
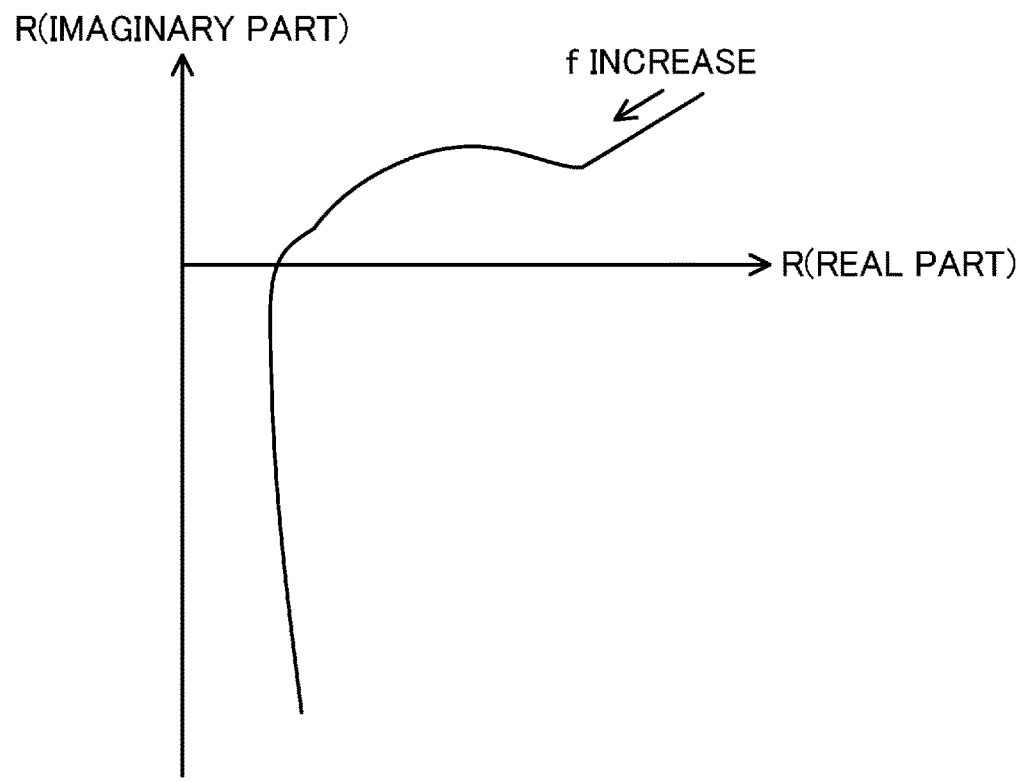
FIG. 4 is a Nyquist diagram showing AC impedance characteristics of a lithium ion battery.

The internal state of the lithium ion battery can be analyzed by an AC impedance method. FIG. 4 is a Nyquist diagram showing the AC impedance characteristics of the lithium ion battery. The AC impedance characteristics of FIG. 4 include AC impedance characteristics of the R-CPE parallel circuits of the cathode, the anode, and the SEI in the equivalent circuit of FIG. 3. Therefore, the AC impedance characteristics of FIG. 4 may be identified with the equivalent circuit of FIG. 3, and the results may be analyzed for the cathode and the anode separately, to obtain AC impedance characteristics of the cathode and the anode.

Figure 5:
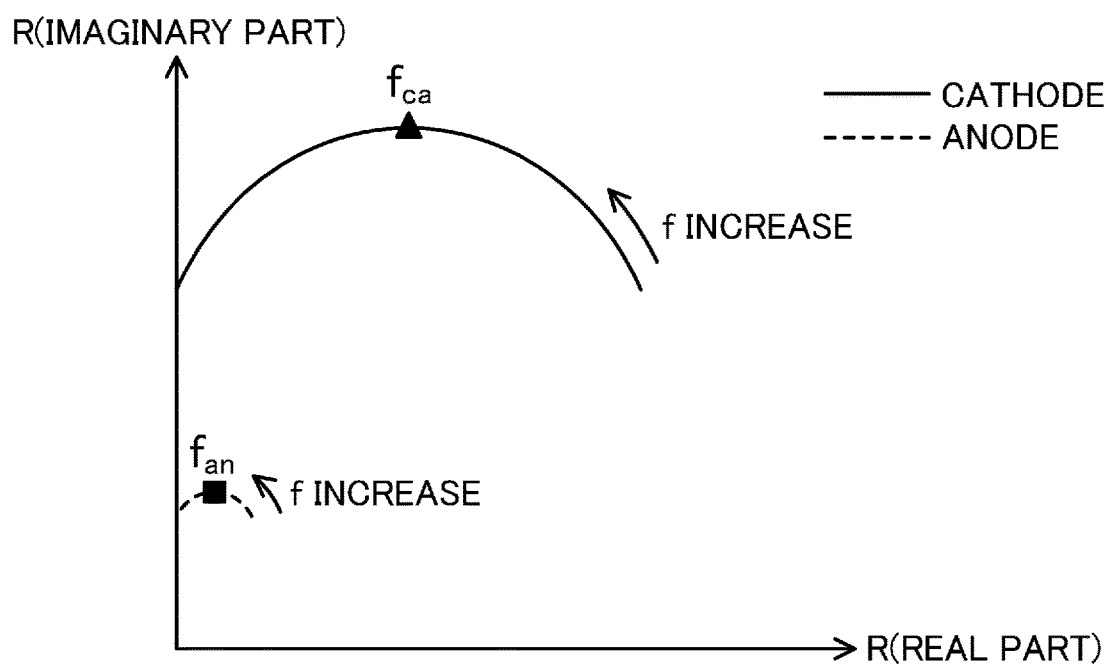
FIG. 5 is a Nyquist diagram showing AC impedance characteristics of a cathode and an anode.

FIG. 5 is a Nyquist diagram showing the AC impedance characteristics of the cathode and the anode. As shown in FIG. 5, the AC impedance characteristics are represented by a semicircular curve for each of the cathode and the anode. The cathode and the anode have inherent vertex frequencies $f_{ca}$ and $f_{an}$, respectively, which are constant even if the lithium ion battery degrades over time. It is therefore possible to calculate the cathode resistance from the voltage and current of the lithium ion battery at the time when time $T_1=1/f_{ca}$ has elapsed, and calculate the anode resistance from the voltage and current of the lithium ion battery at the time when time $T_2=1/f_{an}$ has elapsed, since the lithium ion battery has started supply of electric power to a load. Time $T_1$ corresponds to a "first time" as defined in the claims, and time $T_2$ corresponds to a "second time" as defined in the claims. Note that, while the wording that the resistance is measured will be sometimes used hereinafter, this means that the resistance is calculated from the voltage and the current.

Figure 6:
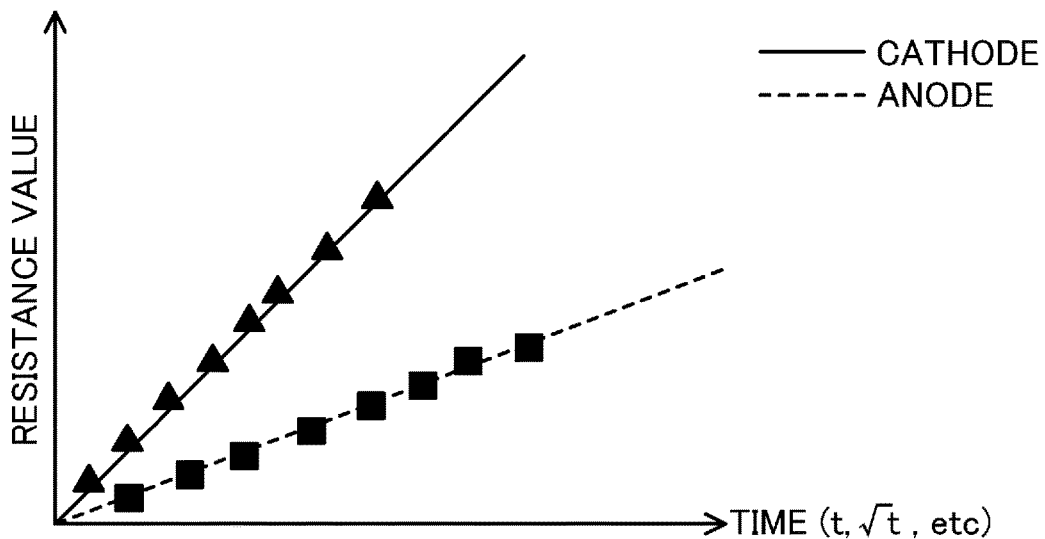
FIG. 6 is a graph showing increases over time in cathode resistance and anode resistance.

The cathode resistance and the anode resistance increase over time, and this causes capacity degradation of the lithium ion battery. The rates of increase over time in cathode resistance and anode resistance can be calculated from the values measured so far. FIG. 6 is a graph showing increases over time in cathode resistance and anode resistance. The graph of FIG. 6 was obtained using the initially-measured cathode resistance and anode resistance as the respective initial values (origins) and blotting subsequently-measured cathode resistances and anode resistances as relative values to the initial values. In this way, by performing multiple linear regression analysis for the cathode resistances and the anode resistances measured at a plurality of past time points, it is possible to calculate the rates of increase over time in cathode resistance and anode resistance. Note that it is also possible to calculate the rates of increase over time in cathode resistance and anode resistance from the previous measured values and the current measured values.

The residual capacity SOH of the lithium ion battery is expressed by $$SOH = \pi \times SOH^{(0)} \qquad (1)$$

where $SOH^{(0)}$ is the residual capacity of the lithium ion battery in its initial (new) state and $\pi$ is the capacity maintenance ratio. That is, the capacity degradation of the lithium ion battery can be grasped as a decrease in capacity maintenance ratio $\pi$. The capacity maintenance ratio $\pi$ can be estimated from the initial values of the capacity maintenance ratios of the cathode and the anode and the rates of increase over time in cathode resistance and anode resistance. The capacity maintenance ratios ilea and of the cathode and anode of the lithium ion battery are expressed by $$\pi_{ca} = f_{ca}(t) + \pi_{ca}^{(0)} \qquad (2)$$

$$\pi_{an} = f_{an}(t) + \pi_{an}^{(0)} \qquad (3)$$

where $\pi_{ca}^{(0)}$ and $\pi_{an}^{(0)}$ are the initial values of the capacity maintenance ratios of the cathode and the anode and $f_{ca}(t)$ and $f_{an}(t)$ are the functions that convert the rates of increase over time in cathode resistance and anode resistance into the rates of capacity decrease (functions having time t as an argument).

Figure 7:
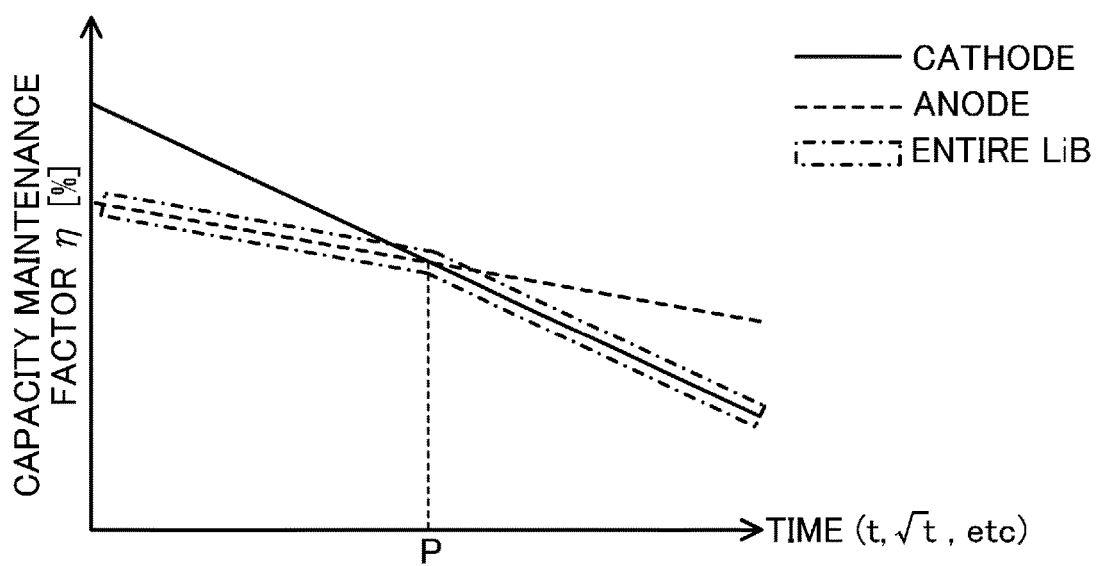
FIG. 7 is a graph showing degradation over time in cathode capacity and anode capacity.

FIG. 7 is a graph showing degradation over time in cathode capacity and anode capacity. Since it is considered that a lithium ion battery is generally manufactured to be cathode-rich or anode-rich, the initial values $\pi_{ca}^{(0)}$ and $\pi_{an}^{(0)}$ of the capacity maintenance ratios of the cathode and the anode are different from each other. Also, the capacity maintenance ratios of the cathode and anode of the lithium ion battery degrade over time independently from each other according to equations (2) and (3). Therefore, when two straight lines representing changes over time in the capacity maintenance ratios of the cathode and the anode are drawn, they may intersect with each other at time P when a predetermined time period has elapsed from the start of use of the lithium ion battery, as shown in FIG. 7.

The capacity maintenance ratio of the entire lithium ion battery is limited to the lower one of the capacity maintenance ratios of the cathode and the anode. Therefore, in the example of FIG. 7, the capacity maintenance ratio $\pi$ of the entire lithium ion battery in equation (1) is $\pi = \pi_{an}$ from the start of use until time P and $\pi = \pi_{ca}$ from time P onward. That is, in the example of FIG. 7, the degradation in anode capacity is predominant for the capacity degradation of the lithium ion battery from the start of use until time P, and then the degradation in cathode capacity becomes predominant from time P onward.

(4) Charge/Discharge Control of LiB 3 by Lithium Ion Battery Charge/Discharge Control Device Next, the charge/discharge control of the LiB 3 by a lithium ion battery charge/discharge control device of this embodiment will be described in detail. The part constituted by the controller 30, the voltage sensor SN1, and the current sensor SN2 corresponds to the lithium ion battery charge/discharge control device of this embodiment.

In the lithium ion battery charge/discharge control device of this embodiment, the controller 30 controls the full charging voltage, the charging current, the discharging current, etc. of the LiB 3 according to the degradation status of the LiB 3 so as to keep the LiB 3 as long as possible. As described above, in the LiB 3, the initial capacity of one of the cathode and the anode is greater than the initial capacity of the other. With use, the capacity degradation proceeds in the cathode and the anode independently from each other, and the residual capacities of the cathode and the anode may be reversed after a lapse of a predetermined time period from the start of use, resulting in that the residual capacity of the one of which the initial capacity was greater may become smaller than the residual capacity of the other of which the initial capacity was smaller. For example, in the example of FIG. 7, while the capacity of the cathode of the LiB 3 is greater than the capacity of the anode at the start of use, the capacity of the cathode degrades faster than the capacity of the anode with use, resulting in that the residual capacity of the cathode becomes smaller than the residual capacity of the anode at and after time P when a predetermined time period has elapsed from the start of use. In consideration of this, the controller 30 calculates the capacity degradation rate for each of the cathode and anode of the LiB 3, and limits the charging and discharging of the LiB 3 based on the comparison results between the capacity degradation rates of the cathode and the anode and determination criterion values for the cathode and the anode. The determination criterion values are values representing standard capacity degradation rates for the cathode and the anode.

A control example by the controller 30 will be described hereinafter. Note that, for the sake of convenience, it is assumed that, in the LiB 3, the initial capacity of the cathode is greater than the initial capacity of the anode, and the residual capacities of the cathode and the anode are reversed at time P, as in the example of FIG. 7.

Figure 8:
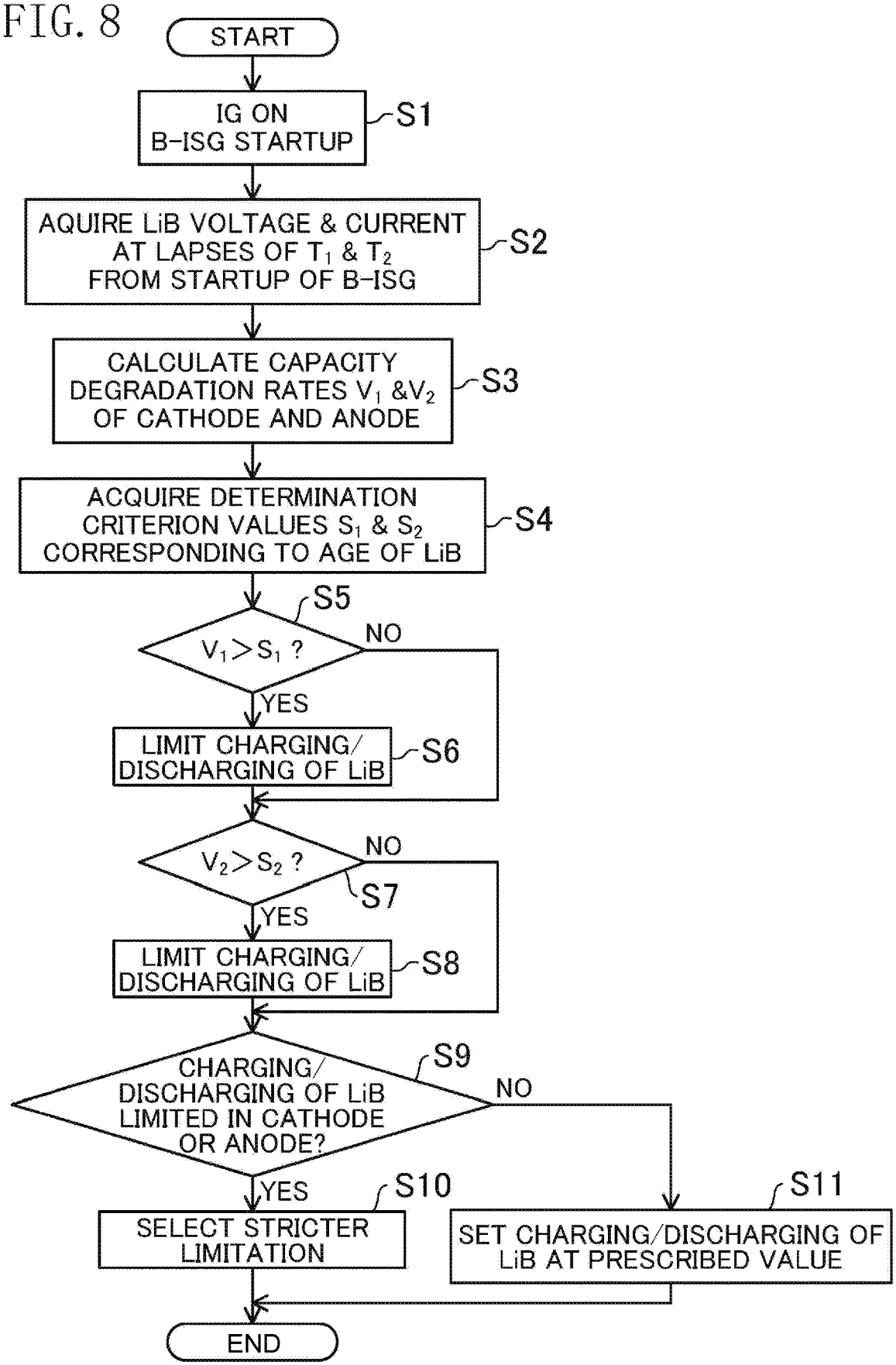
FIG. 8 is a flowchart showing a procedure of control performed during startup of an engine.

FIG. 8 is a flowchart showing a procedure of control performed by the controller 30 during startup of the engine.

When the ignition switch is turned ON in step S1, the voltage sensor SN1 and the current sensor SN2 start detection of the voltage V and current I of the LiB 3. Further, once detecting that the start switch has been turned ON from input information from the start switch sensor SN3, the controller 30 starts the B-ISG 1 with the LiB 3.

In step S2, the controller 30 acquires, from the voltage sensor SN1 and the current sensor SN2, the detected values of the voltage and current of the LiB 3 at the time when time $T_1$ has elapsed, and the detected values of the voltage and current of the LiB 3 at the time when time $T_2$ has elapsed, since the LiB 3 has started supply of electric power to the B-ISG 1. Time $T_1$ and time $T_2$ are characteristic values of the LiB 3: e.g., $T_1$=0.1 seconds and $T_2$=0.5 seconds.

Once acquiring the voltage and current of the LiB 3, the controller 30 calculates capacity degradation rates $V_1$ and $V_2$ of the cathode and anode of the LiB 3 according to the above-described method in step S3. As described above, the cathode resistance and anode resistance of the LiB 3 increase over time, causing capacity degradation of the LiB 3. The rates of increase over time in cathode resistance and anode resistance can be calculated from the values of the cathode resistance and anode resistance of the LiB 3 measured so far. Further, from the rates of increase over time in cathode resistance and anode resistance, the capacity maintenance ratios of the cathode capacity and the anode capacity can be calculated as shown in FIG. 7. The capacity degradation rates $V_1$ and $V_2$ of the cathode and anode of the LiB 3 correspond to the rates of decrease in the capacity maintenance ratios of the cathode capacity and the anode capacity.

The reason why the capacity degradation rates $V_1$ and $V_2$ of the cathode and anode of the LiB 3 are calculated from the voltage and current of the LiB 3 during the startup of the B-ISG 1 is that a large current is output from the LiB 3 when the B-ISG 1 is started, and by referring to the voltage and current of the LiB 3 at the time when such a large current is output from the LiB 3, it is possible to calculate the cathode resistance and the anode resistance with higher precision.

Once the capacity degradation rates $V_1$ and $V_2$ of the cathode and anode of the LiB 3 are calculated, the controller 30 acquires determination criterion values for the cathode and the anode in step S4. The determination criterion values for the cathode and the anode are values calculated beforehand considering the characteristics of the LiB 3 such as the initial capacities of the cathode and the anode, the capacity degradation rates of the cathode and the anode, and the time at which the residual capacities of the cathode and the anode are reversed, and represented as a function having time t as an argument or as a lookup table, etc.

Figure 9:
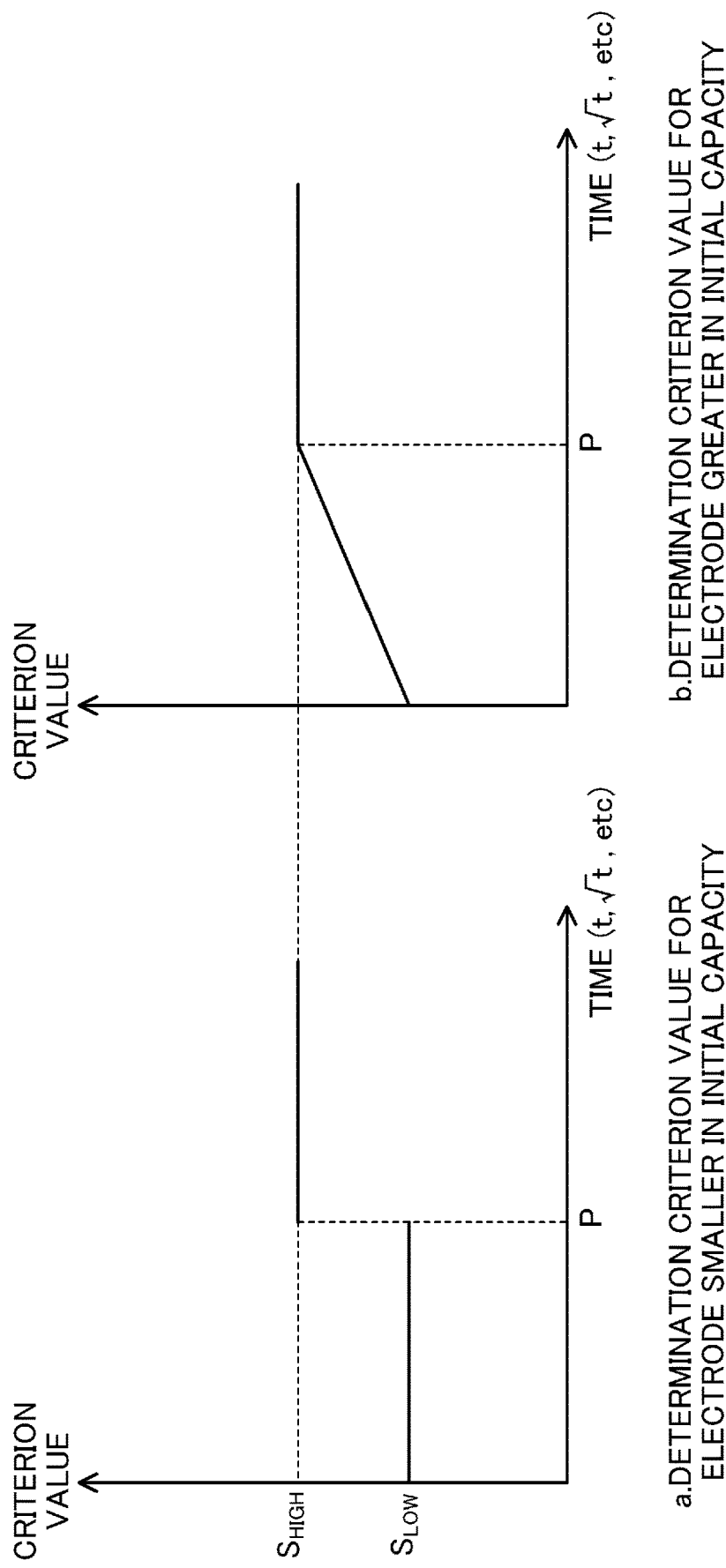
FIG. 9 shows graphs of determination criterion values for the cathode and anode of a lithium ion battery.

FIG. 9 shows graphs of the determination criterion values for the cathode and anode of the LiB 3. The determination criterion value for the electrode smaller in initial capacity, i.e., the anode of the LiB 3 in this embodiment is set constant at $S_{LOW}$ from the start of use of the LiB 3 until time P and set constant at $S_{HIGH}$ ($>S_{LOW}$) from time P onward. On the other hand, the determination criterion value for the electrode greater in initial capacity, i.e., the cathode of the LiB 3 in this embodiment is set at a value lower (looser) than $S_{HIGH}$, especially at a value gradually increasing toward $S_{HIGH}$, from the start of use of the LiB 3 until time P, while it is set constant at $S_{HIGH}$ from time P onward. Referring to FIG. 7, the capacity degradation rate of the anode is slower than the capacity degradation rate of the cathode. Therefore, the determination criterion values for the anode and the cathode may be fixed to $S_{LOW}$ and $S_{HIGH}$, respectively, through the entire time period. However, since the entire capacity degradation rate of the LiB 3 is defined by the capacity degradation rate of the cathode from time P onward, the determination criterion value is changed between before and after time P as shown in FIG. 9. That is, from the start of use of the LiB 3 until time P, the original determination criterion value $S_{LOW}$ is used for the anode, and a value lower than $S_{HIGH}$ is used for the cathode since there is no need for the cathode to use the original determination criterion value $S_{HIGH}$. After time P onward, $S_{HIGH}$ that is higher (stricter) than the original determination criterion value $S_{LOW}$ is used for the anode, and also the original determination criterion value $S_{HIGH}$ is used for the cathode.

Referring back to FIG. 8, in step S5, the controller 30 compares the capacity degradation rate $V_1$ of the cathode with the determination criterion value $S_1$ for the cathode. If YES, the controller 30 limits the charging and discharging of the LiB 3 in step S6.

Figure 10:
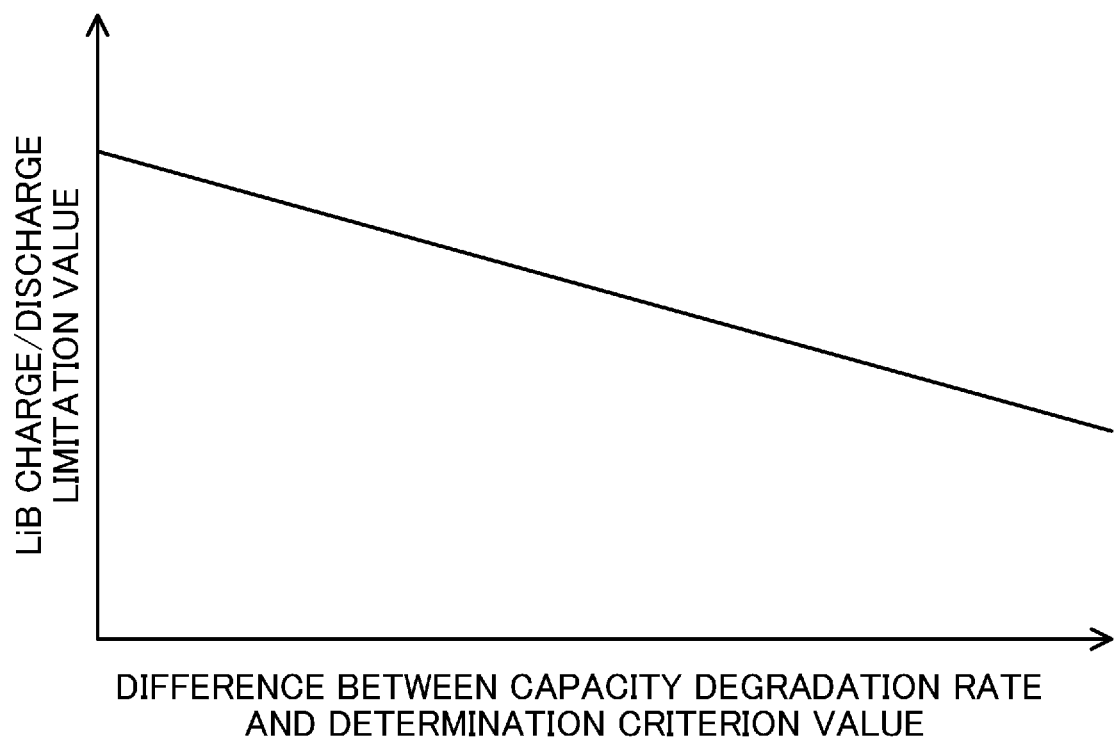
FIG. 10 is a graph showing a charge/discharge control value for a lithium ion battery.

FIG. 10 is a graph showing the charge/discharge control value of the LiB 3. The controller 30 controls the charging and discharging of the LiB 3 so that all of the full charging voltage and the charging and discharging current per unit time of the LiB 3 should be smaller as the difference between the capacity degradation rate $V_1$ of the cathode and the determination criterion value $S_1$ for the cathode is greater, i.e., the capacity degradation rate of the cathode is greater.

Referring back to FIG. 8, if NO in step S5, or after step S6, the controller 30 compares the capacity degradation rate $V_2$ of the anode with the determination criterion value $S_2$ for the anode in step S7. If YES, the controller 30 limits the charging and discharging of the LiB 3 in step S8. At this time, the controller 30 controls the charging and discharging of the LiB 3 so that all of the full charging voltage and the charging and discharging current per unit time of the LiB 3 should be small according to the difference between the capacity degradation rate $V_2$ of the anode and the determination criterion value $S_2$ for the anode.

Thereafter, in step S9, the controller 30 determines whether or not the charging and discharging of the LiB 3 has been limited based on the capacity degradation rate of the cathode or the anode. If YES, the controller 30 selects stricter one of the limitations of the charging and discharging of the LiB 3 based on the capacity degradation rates of the cathode and the anode in step S10. If NO, the controller 30 sets a prescribed value without limitation of the charging and discharging of the LiB 3 in step S11.

(5) Function

As described above, in this embodiment, the lithium ion battery charge/discharge control device that controls charging and discharging of the LiB 3 that starts the B-ISG 1 includes: the voltage sensor SN1 that detects the voltage of the LiB 3; the current sensor SN2 that detects the current of the LiB 3; and the controller 30 that controls charging and discharging of the LiB 3. The controller 30 calculates the capacity degradation rates $V_1$ and $V_2$ of the cathode and anode of the LiB 3 based on the detected values of the voltage sensor SN1 and the current sensor SN2 at the time when time $T_1$ has elapsed, and the detected values of the voltage sensor SN1 and the current sensor SN2 at the time when time $T_2$, longer than time $T_1$, has elapsed, from the startup of the B-ISG 1, and limits the charging and discharging of the LiB 3 based on the comparison results between the capacity degradation rates $V_1$ and $V_2$ of the cathode and the anode and the determination criterion values $S_1$ and $S_2$ for the cathode and the anode.

Having the configuration described above, since the charging and discharging of the LiB 3 is limited according to the capacity degradation rates of the cathode and the anode, it is possible to perform charge/discharge control conforming to the reality of the LiB 3 such as that the capacity degradation proceeds in the cathode and the anode independently from each other, whereby, by delaying the progress of the capacity degradation of the LiB 3, the usable duration thereof can be extended.

(6) Alteration

While the case of applying the technology disclosed herein to a gasoline engine-mounted vehicle has been described as an example in the above embodiment, the technology disclosed herein is also naturally applicable to vehicles having engines other than the gasoline engine (e.g., a diesel engine).

Also, since the residual capacity of the cathode is to define the residual capacity of the entire LiB 3 from time P onward, the controller 30 may limit the charging and discharging of the LiB 3 based on only the comparison result between the capacity degradation rate $V_1$ of the cathode and the determination criterion value $S_1$ for the cathode from time P onward, omitting steps S7 and S8.

INDUSTRIAL APPLICABILITY

As described above, the technology disclosed herein is useful as a lithium ion charge/discharge control device.

DESCRIPTION OF REFERENCE CHARACTERS

1 B-ISG (engine starter)
3 LiB (lithium ion battery)
SN1 Voltage sensor
SN2 Current sensor
30 Controller (control section)

The invention claimed is:

1. A lithium ion battery charge/discharge control device that controls charging and discharging of a lithium ion battery that starts an engine starter, comprising:
   a voltage sensor that detects a voltage of the lithium ion battery;
   a current sensor that detects a current of the lithium ion battery; and
   a controller that controls charging and discharging of the lithium ion battery,
   wherein the controller calculates capacity degradation rates of a cathode and anode of the lithium ion battery based on
      detected values of the voltage sensor and the current sensor at the time when a first time has elapsed, and
      detected values of the voltage sensor and the current sensor at the time when a second time, longer than the first time, has elapsed, from startup of the engine starter, and
   the controller limits the charging and discharging of the lithium ion battery when
      the calculated capacity degradation rate of the cathode is larger than a determination criterion value for the cathode or
      the calculated capacity degradation rate of the anode is larger than a determination criterion value for the anode,
   while the controller fails to limit the charging and discharging of the lithium ion battery when
      the calculated capacity degradation rate of the cathode is smaller than the determination criterion value for the cathode and
      the calculated capacity degradation rate of the anode is smaller than the determination criterion value for the anode.

2. The lithium ion battery charge/discharge control device of claim 1,
   wherein an initial capacity of a first electrode as one of the cathode and anode of the lithium ion battery is greater than an initial capacity of a second electrode as the other, and capacity degradation proceeds with use in both electrodes independently from each other, so that residual capacities of the first and second electrodes are reversed after a lapse of a predetermined time period from the start of use,
   resulting in that the residual capacity of the first electrode becomes smaller than the residual capacity of the second electrode, and the controller uses different values from each other as the determination criterion values for the cathode and the anode during the predetermined time period.

3. The lithium ion battery charge/discharge control device of claim 2,
   wherein the controller uses the determination criterion value for the first electrode as the determination criterion values for the cathode and the anode after the predetermined time period.

4. The lithium ion battery charge/discharge control device of claim 2, wherein
the determination criterion value for the first electrode during the predetermined time period is set at a value lower than the determination criterion value after the predetermined time period.

5. The lithium ion battery charge/discharge control device of claim 4, wherein
the determination criterion value for the first electrode gradually increases during the predetermined time period toward the determination criterion value after the predetermined time period.

6. The lithium ion battery charge/discharge control device of claim 2,
wherein the controller limits the charging and discharging of the lithium ion battery based on only the comparison result between the capacity degradation rate of the first electrode and the determination criterion value for the first electrode after the predetermined time period,
while during the predetermined time period, the controller limits the charging and discharging of the lithium ion battery when the calculated capacity degradation rate of the cathode is larger than the determination criterion value for the cathode or the calculated capacity degradation rate of the anode is larger than the determination criterion value for the anode.

7. The lithium ion battery charge/discharge control device of claim 1,
wherein when the calculated capacity degradation rate of the cathode is larger than the determination criterion value for the cathode, the controller controls the charging and discharging of the lithium ion battery so that full charging voltage and charging and discharging current per unit time is smaller as difference between the capacity degradation rate of the cathode and the determination criterion value for the cathode is greater, and
when the calculated capacity degradation rate of the anode is larger than the determination criterion value for the anode, the controller controls the charging and discharging of the lithium ion battery so that full charging voltage and charging and discharging current per unit time is smaller as difference between the capacity degradation rate of the anode and the determination criterion value, for the anode is greater.

8. The lithium ion battery charge/discharge control device of claim 7,
wherein when the charging and discharging of the lithium ion battery is limited based on the capacity degradation rate of the cathode or anode,
the controller selects stricter one of the limitations of the charging and discharging of the lithium ion battery based on the capacity degradation rates of the cathode and anode.

9. The lithium ion battery charge/discharge control device of claim 2, wherein
the determination criterion value for the first electrode is set at a first constant value after the lapse of the predetermined time period from the start of use, and is set at a value lower than the first constant value and gradually increasing toward the first constant value during the predetermined time, and
the determination criterion value for the second electrode is set at a second constant value lower than the first constant value during the predetermined time, and is set at the first constant value after the lapse of the predetermined time period.

* * * * *